(12) United States Patent
Toyoda

(10) Patent No.: US 11,948,937 B2
(45) Date of Patent: Apr. 2, 2024

(54) SEMICONDUCTOR INTEGRATED CIRCUIT WITH EDGE STRUCTURE TO DECREASE LEAKAGE CURRENT

(71) Applicant: FUJI ELECTRIC CO., LTD., Kawasaki (JP)

(72) Inventor: Yoshiaki Toyoda, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 238 days.

(21) Appl. No.: 17/238,908

(22) Filed: Apr. 23, 2021

(65) Prior Publication Data

US 2021/0242198 A1 Aug. 5, 2021

Related U.S. Application Data

(63) Continuation of application No. PCT/JP2020/014219, filed on Mar. 27, 2020.

(30) Foreign Application Priority Data

May 16, 2019 (JP) .................................. 2019-093138

(51) Int. Cl.
*H01L 27/07* (2006.01)
*H01L 27/02* (2006.01)
(Continued)

(52) U.S. Cl.
CPC ...... *H01L 27/0727* (2013.01); *H01L 27/0207* (2013.01); *H01L 29/1083* (2013.01); *H01L 27/0883* (2013.01)

(58) Field of Classification Search
CPC ............. H01L 27/0727; H01L 27/0207; H01L 29/1083; H01L 27/0883
See application file for complete search history.

(56) References Cited

U.S. PATENT DOCUMENTS 6,323,518 B1 * 11/2001 Sakamoto ........... H01L 29/7803
257/E27.06
2016/0056148 A1 * 2/2016 Kanno ................ H01L 29/1095
257/139
(Continued)

FOREIGN PATENT DOCUMENTS

JP H07-211802 A 8/1995
JP 200091344 A 3/2000
(Continued)

OTHER PUBLICATIONS

International Search Report dated Jun. 16, 2020 from International Application No. PCT/JP2020/014219, 4 pages.
(Continued)

*Primary Examiner* — Nduka E Ojeh
*Assistant Examiner* — Bruce R. Smith

(57) ABSTRACT

A semiconductor integrated circuit includes: a semiconductor base body of a first conductivity-type; a bottom surface electrode to which a first potential is applied, the bottom surface electrode being provided on a bottom surface of the semiconductor base body; a first well of a second conductivity-type to which a second potential lower than the first potential is applied, the first well being provided on a top surface side of the semiconductor base body; a second well of the first conductivity-type provided in the first well; and an edge structure provided in the first well and configured to supply a third potential higher than the second potential to the second well.

16 Claims, 7 Drawing Sheets

(51) Int. Cl.
*H01L 27/088* (2006.01)
*H01L 29/10* (2006.01)

(56) References Cited

U.S. PATENT DOCUMENTS

| | | | |
|---|---|---|---|
| 2017/0077081 A1* | 3/2017 | Toyoda | H01L 27/0629 |
| 2017/0133401 A1 | 5/2017 | Kanno et al. | |
| 2017/0141114 A1 | 5/2017 | Kanno et al. | |
| 2020/0052071 A1* | 2/2020 | Chen | H01L 29/42316 |

FOREIGN PATENT DOCUMENTS

| | | |
|---|---|---|
| JP | 2005191263 A | 7/2005 |
| JP | 201642558 A | 3/2016 |
| JP | 2018110142 A | 7/2018 |
| WO | 2016132417 A1 | 8/2016 |
| WO | 2016132418 A1 | 8/2016 |

OTHER PUBLICATIONS

Written Opinion of the International Searching Authority dated Jun. 16, 2020 from International Application No. PCT/JP2020/014219, 3 pages.

Chinese Office Action dated Nov. 10, 2023 for corresponding Chinese Application No. 202080005944.1, 11 pages.

* cited by examiner

SEMICONDUCTOR INTEGRATED CIRCUIT WITH EDGE STRUCTURE TO DECREASE LEAKAGE CURRENT

CROSS-REFERENCE TO RELATED APPLICATION

This application is a Continuation of PCT Application No. PCT/JP2020/014219, filed on Mar. 27, 2020, and claims the priority of Japanese Patent Application No. 2019-093138, filed on May 16, 2019, the contents of both of which are incorporated herein by reference.

BACKGROUND

1. Field of the Invention

The present invention relates to semiconductor integrated circuits, and more particularly, to a power semiconductor integrated circuit (a power IC).

2. Description of the Related Art

To achieve a high reliability, and a reduction in size and a reduction in cost of power semiconductor elements, a power IC is disclosed in which a vertical MOS transistor as a power semiconductor element at an output stage and a horizontal MOS transistor implementing a circuit for controlling the vertical MOS transistor are monolithically integrated (packaged together) on the same semiconductor chip (refer to JP 2000-91344 A and JP 2018-110142 A). An example of such a power IC is a vehicle power IC called an intelligent power switch (IPS).

When an n-type substrate is used as a semiconductor chip, the bottom surface of the substrate corresponds to a drain side of the vertical MOS transistor, and is connected to a power supply terminal on a high potential side to which a battery is connected and a power supply potential is applied. When the substrate is fixed to the power supply potential, a p-type well and an n-type well need to be provided at an upper part of the substrate to implement an n-p-n junction structure (a multi-diffusion structure) so as to form a horizontal pMOS transistor for a circuit usable at a floating potential.

When mounted on a vehicle, a power supply terminal of a high-side power IC is typically required to have a breakdown voltage of about 50 to 60 volts or greater. When a high voltage is applied between the n-type substrate and the p-type well (referred to below as a "p-well"), an occurrence of a punch-through should be prevented in the n-p-n junction structure.

When the high-side power IC is in a normal operation, the power supply potential (a first potential) is applied to the bottom surface of the substrate, and a ground potential (a second potential) lower than the first potential is applied to the p-well provided at the upper part of the substrate. In addition, a third potential lower than the first potential and higher than the second potential is applied to the n-type well (referred to below as an "n-well") provided at the upper part of the substrate. When the high-side power IC is in a particular state such as on standby, the third potential applied to the n-well is controlled to be decreased to the ground potential in order to decrease power consumption.

In the state in which the third potential applied to the n-well is decreased to lead the potential of the n-well and the potential of the p-well to be equal to each other, a leakage current increases as the temperature increases, and the punch-through breakdown voltage in the n-p-n junction structure decreases. Although the power IC is designed to deal with the decrease in the punch-through breakdown voltage, the circuit needs to control the potential of the n-well and the potential of the p-well need so as not to be equal to each other in the particular state such as on standby.

SUMMARY

In view of the foregoing problems, the present invention provides a semiconductor integrated circuit capable of avoiding a leakage current at a high temperature to improve a punch-through breakdown voltage in a multi-diffusion structure including a plurality of wells.

An aspect of the present invention inheres in a semiconductor integrated circuit including: a semiconductor base body of a first conductivity-type; a bottom surface electrode to which a first potential is applied, the bottom surface electrode being provided on a bottom surface of the semiconductor base body; a first well of a second conductivity-type to which a second potential lower than the first potential is applied, the first well being provided on a top surface side of the semiconductor base body; a second well of the first conductivity-type provided in the first well; and an edge structure provided in the first well and configured to supply a third potential higher than the second potential to the second well.

DESCRIPTION OF THE EMBODIMENTS

Figure 1:
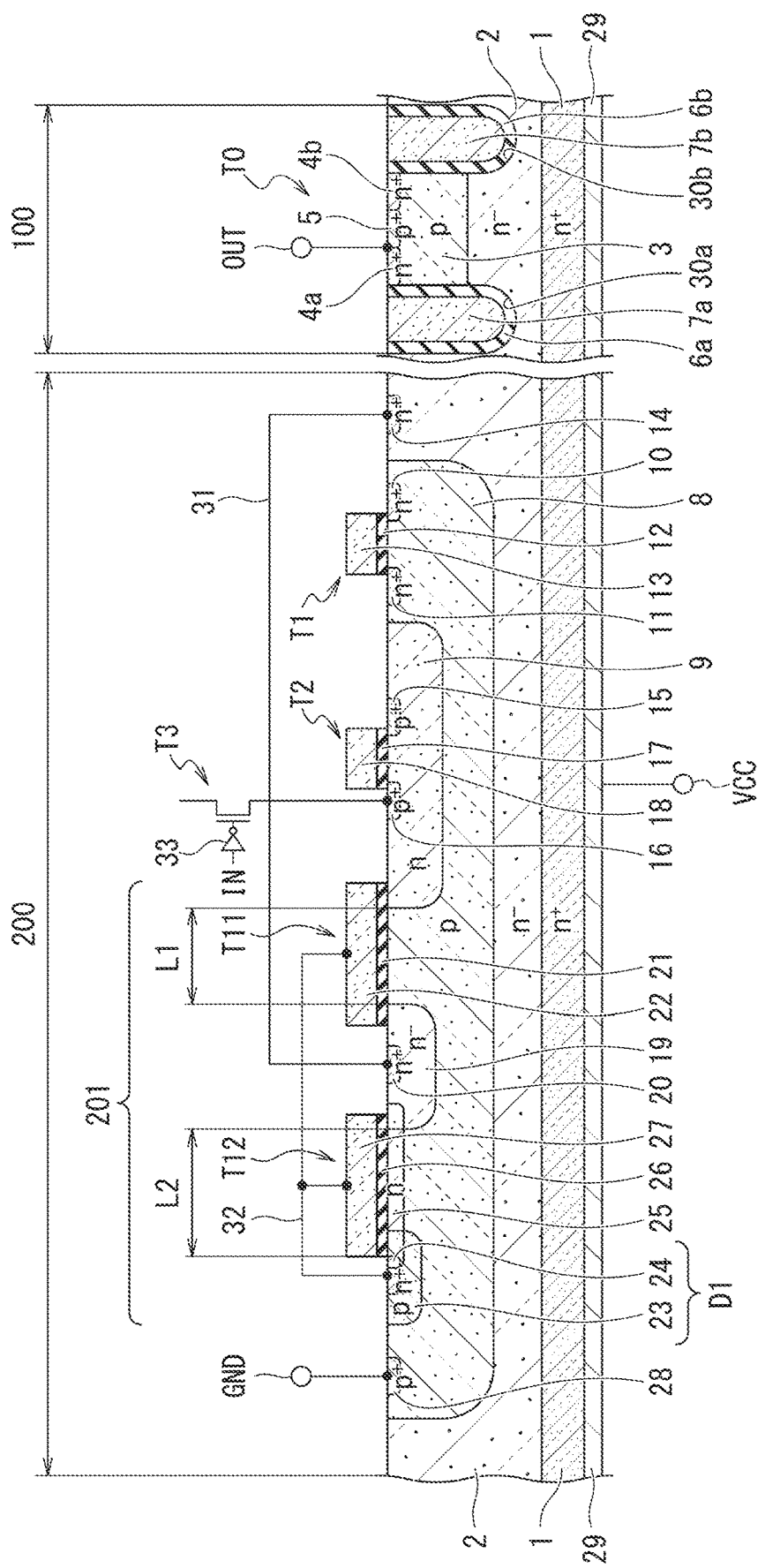
FIG. 1 is a cross-sectional view of main components illustrating an example of a semiconductor integrated circuit according to an embodiment of the present invention.

With reference to the Drawings, embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In the embodiment, a "first main electrode region" and a "second main electrode region" are defined in a semiconductor element, which is integrated in a semiconductor chip as an output stage element. The first main electrode region and the second main electrode region are a main electrode region of the semiconductor element, in which a main current flows in or out. The first main electrode region of the semiconductor element integrated as the output stage element is assigned to a semiconductor region which is an emitter region or a collector region in an insulated-gate bipolar transistor (IGBT). The first main electrode region of the integrated output stage element is assigned to a semiconductor region which is a source region or a drain region in a field-effect transistor (FET) or a static induction transistor (SIT). The first main electrode region of the integrated output stage element is assigned to a semiconductor region which is an anode region or a cathode region in a static induction (SI) thyristor or a gate turn-off (GTO) thyristor.

The second main electrode region of the integrated output stage element is assigned to a semiconductor region which is not assigned as the first main electrode region and will be the emitter region or the collector region in the IGBT, the source region or the drain region in the FET or the SIT, and the anode region or the cathode region in the SI thyristor or the GTO thyristor. That is, when the first main electrode region of the output stage element integrated in a semiconductor chip is the source region, the second main electrode region means the drain region. When the first main electrode region is the emitter region, the second main electrode region means the collector region. When the first main electrode region is the anode region, the second main electrode region means the cathode region.

In a semiconductor integrated circuit according to the embodiment, various semiconductor elements are monolithically integrated in a single semiconductor chip. In the embodiment, a "third main electrode region" and a "fourth main electrode region" of a circuit element (semiconductor element) integrated in a circuit unit is assigned to a semiconductor region which is a source region or a drain region in the FET or the SIT, in which a main current flows in or out. In some appropriate cases, a function of the third main electrode region and a function of the fourth main electrode region are exchangeable each other by exchanging a bias relationship if the structure of the subject semiconductor device is symmetric such as metal-insulator-semiconductor (MIS) FET. A "fifth main electrode region" and a "sixth main electrode region" of a circuit element (semiconductor element) integrated in a circuit unit is assigned to a semiconductor region which is a source region or a drain region in the FET or the SIT.

When a complementary MOS (CMOS) is implemented, which of the third main electrode region to the sixth main electrode region is assigned to the source region or the drain region is determined by requirements on the circuit.

Also, a "first main terminal region", a "second main terminal region", a "fifth main terminal region" and a "sixth main terminal region" of a circuit element (semiconductor element) integrated in a circuit unit is assigned to a semiconductor region which is a source region or a drain region determined by requirements on the circuit design. A "third main terminal region" and a "fourth main terminal region" used in a diode is assigned to a semiconductor region which is anode region or a cathode region.

Further, definitions of directions such as an up-and-down direction such as "top surface" or "bottom surface" or right-and-left direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity type is an n-type and a second conductivity type is a p-type. However, the relationship of the conductivity types may be inverted to set the first conductivity type to the p-type and the second conductivity type to the n-type.

Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration.

<Semiconductor Integrated Circuit>

A semiconductor integrated circuit according to an embodiment of the present invention is a high-side power IC in which an output part 100 and a circuit part 200 are monolithically integrated on the same semiconductor chip, as illustrated in FIG. 1. FIG. 1 illustrates a case in which a semiconductor base body (1, 2) has a structure including a low specific-resistance layer 1 of a semiconductor substrate (a Si wafer) of a first conductivity-type ($n^+$-type) having a high impurity concentration, and a high specific-resistance layer 2 of the first conductivity-type ($n^-$-type) having a lower impurity concentration than the low specific-resistance layer 1 and epitaxially grown on the low specific-resistance layer 1. While the semiconductor integrated circuit according to the embodiment is illustrated with the case in which the semiconductor base body (1, 2) composing a semiconductor chip includes a semiconductor material made of silicon (Si) as a parent material, the parent material is not limited to Si. The semiconductor base body (1, 2) may be configured such that the low specific-resistance layer 1 of an $n^+$-type impurity-doped layer is formed on the bottom surface of the $n^-$-type semiconductor substrate (the Si wafer) serving as the high specific-resistance layer 2 by ion implantation or thermal diffusion.

When the semiconductor substrate is the low specific-resistance layer 1, the impurity concentration of the low specific-resistance layer 1 is in a range of about $2\times10^{18}$ cm$^{-3}$ to $1\times10^{19}$ cm$^{-3}$, for example. The impurity concentration of the high specific-resistance layer 2 in this case can be set in a range of about $1\times10^{12}$ cm$^{-3}$ to $1\times10^{16}$ cm$^{-3}$, and is in a range of about $1\times10^{15}$ cm$^{-3}$ to $1\times10^{16}$ cm$^{-3}$, for example. When the low specific-resistance layer 1 of the $n^+$-type impurity-doped layer is deposited on the bottom surface of the high specific-resistance layer 2 of the $n^-$-type semiconductor substrate, the impurity concentration of the low specific-resistance layer 1 may be set in a range of about $5\times10^{18}$ cm$^{-3}$ to $1\times10^{21}$ cm$^{-3}$. The impurity concentration of the low specific-resistance layer 1 is not necessarily uniform, and may have an impurity profile so as to be increased to about $1\times10^{21}$ cm$^{-3}$ at the interface with a bottom surface electrode 29 connected to the low specific-resistance layer 1. For example, the low specific-resistance layer 1 may have a composite structure including a layer in a range of about $5\times10^{18}$ cm$^{-3}$ to $2\times10^{19}$ cm$^{-3}$ on the high specific-resistance layer 2 side and a layer in a range of about $3\times10^{19}$ cm$^{-3}$ to $1\times10^{21}$ cm$^{-3}$ on the bottom surface electrode side.

FIG. 1 illustrates on the right side a vertical nMOS transistor of trench-gate type as an output-stage element T0 that is a power semiconductor element integrated in the output part 100. The low specific-resistance layer 1 partly functions as a first main electrode region (a drain region) of the output-stage element T0, and the high specific-resistance layer 2 arranged on the first main electrode region partly functions as a drift layer of the output-stage element T0. The bottom surface electrode 29 serving as a drain electrode is deposited on the bottom surface side of the low specific-resistance layer 1. The bottom surface electrode 29 is connected to a first potential terminal (a power supply terminal) VCC. A first potential (a power supply potential) V1 on a high potential side is applied to the first potential terminal VCC. The first potential is about 13 volts, for example.

A body region (a base region) 3 of a second conductivity-type (p-type) is partly provided at the upper part of the high specific-resistance layer 2 located in the output part 100. The upper part of the body region 3 is selectively provided with second main electrode regions (source regions) 4a and 4b of the first conductivity-type (n$^+$-type) having a higher impurity concentration than the high specific-resistance layer 2. The upper part of the body region 3 is further selectively provided with a base contact region 5 of p$^+$-type in contact with the respective second main electrode regions 4a and 4b. The base contact region 5 and the second main electrode regions 4a and 4b are connected to an output terminal OUT.

In terms of a unit cell illustrated in FIG. 1, a pair of gate trenches 30a and 30b opposed to each other are dug into the top surface of the body region 3. The gate trenches 30a and 30b are provided such that at least the side surfaces are partly in contact with the body region 3, and are dug more deeply than the body region 3. While FIG. 1 illustrates the pair of the gate trenches 30a and 30b in cross section, the embodiment may include a single circular trench in a plan view actually integrated on the back side of the sheet of FIG. 1.

The gate trenches 30a and 30b are provided with gate insulating films 6a and 6b along the inner surfaces of the gate trenches 30a and 30b. A gate electrode 7a is buried in the gate trench 30a via the gate insulating film 6a to implement a trench control electrode structure (6a, 7a). Similarly, a gate electrode 7b is buried in the gate trench 30b via the gate insulating film 6b to implement a trench control electrode structure (6b, 7b).

An example of material used for the gate insulating films 6a and 6b may be a silicon oxide (SiO$_2$) film, and other examples other than the SiO$_2$ film include a silicon oxynitride (SiON) film, a strontium oxide (SrO) film, a silicon nitride (Si$_3$N$_4$) film, and an aluminum oxide (Al$_2$O$_3$) film. Still other examples include a magnesium oxide (MgO) film, an yttrium oxide (Y$_2$O$_3$) film, a hafnium oxide (HfO$_2$) film, a zirconium oxide (ZrO$_2$) film, a tantalum oxide (Ta$_2$O$_5$) film, and a bismuth oxide (Bi$_2$O$_3$) film. Further, two or more of these single layers may be chosen and stacked on one another so as to be used as a composite film.

An example of material used for the gate electrodes 7a and 7b may be polysilicon (doped polysilicon) to which n-type impurity ions are doped at a high concentration, and other examples other than the doped polysilicon (DOPOS) include refractory metal such as tungsten (W), molybdenum (Mo), and titanium (Ti), and silicide of the refractory metal and the polysilicon. The material used for the gate electrodes 7a and 7b may be polycide which is a composite film of the polysilicon and the silicide of the refractory metal.

The gate electrode 7a electrostatically controls a surface potential of a semiconductor region toward the right-side surface of the gate trench 30a of the body region 3 via the gate insulating film 6a, so as to provide an inversion channel on the side surface of the gate trench 30a of the body region 3. The gate electrode 7b electrostatically controls a surface potential of the semiconductor region toward the left-side surface of the gate trench 30b of the body region 3 via the gate insulating film 6b, so as to provide an inversion channel on the side surface of the gate trench 30b of the body region 3.

In the output-stage element T0, a main current flows between the respective second main electrode regions 4a and 4b on the top surface side and the first main electrode region composed of a part of the low specific-resistance layer 1 on the bottom surface side opposed to the second main electrode regions 4a and 4b. In terms of the unit cell, the main current in the vertical nMOS transistor flows adjacent to the two second main electrode regions 4a and 4b located on the top surface side via the two inversion channels defined with respect to the respective second main electrode regions 4a and 4b.

The circuit part 200 illustrated in the middle part and on the left side of the middle part in FIG. 1 includes a first circuit element T1 and a second circuit element T2 for controlling the output-stage element T0. For example, the circuit part 200 may use a complementary MOS (CMOS) as a circuit element including the first circuit element T1 as a horizontal nMOS transistor and the second circuit element T2 as a pMOS transistor. The first circuit element T1 is arranged on a first well of the second conductivity-type (p-type) (referred to below as a "p-well") 8 deposited at the upper part of the high specific-resistance layer 2. An impurity concentration of the p-well 8 is about $1\times10^{16}$ cm$^{-3}$, for example. The impurity concentration of the p-well 8 may be substantially the same as the impurity concentration of the body region 3 in the output part 100. A depth of the p-well 8 may be substantially the same as the depth of the body region 3 in the output part 100.

The first circuit element T1 is provided on a third main electrode region (a source region) 10 and a fourth main electrode region (a drain region) 11 of the first conductivity-type (n$^+$-type) that are opposed to each other at the upper part of the p-well 8. The third main electrode region 10 and the fourth main electrode region 11 are selectively provided at the upper part of the p-well 8 separately from each other, and are each a semiconductor region of n$^+$-type having a higher impurity concentration than the high specific-resistance layer 2. The impurity concentration of each of the third main electrode region 10 and the fourth main electrode region 11 may be substantially the same as the impurity concentration of the second main electrode regions 4a and 4b in the output part 100. A depth of each of the third main electrode region 10 and the fourth main electrode region 11 may be substantially the same as the depth of the second main electrode regions 4a and 4b in the output part 100.

A flat control electrode structure (12, 13) laterally extends on the p-well 8. The control electrode structure (12, 13)

includes a gate insulating film 12 provided on the p-well 8 between the third main electrode region 10 and the fourth main electrode region 11, and a gate electrode 13 deposited on the gate insulating film 12. The gate insulating film 12 can be made of the same material as the gate insulating films 6a and 6b, which is a $SiO_2$ film, for example.

The gate electrode 13 electrostatically controls the surface potential of the p-well 8 via the gate insulating film 12 so as to form an inversion channel in the surface layer of the p-well 8. A material used for the gate electrode 13 may be the same as the material used for the gate electrodes 7a and 7b, which is DOPOS, for example.

The second circuit element T2 is provided on a second well of the first conductivity-type (n-type) (referred to below as a "n-well") 9 having a higher impurity concentration than the high specific-resistance layer 2. An impurity concentration of the n-well 9 is about $1 \times 10^{17}$ $cm^{-3}$, for example. The second circuit element T2 is provided on a fifth main electrode region (a source region) 15 and a sixth main electrode region (a drain region) 16 of the second conductivity-type ($p^+$-type) that are opposed to each other at the upper part of the n-well 9. The fifth main electrode region 15 and the sixth main electrode region 16 are selectively provided at the upper part of the n-well 9 separately from each other, and are each a semiconductor region of $p^+$-type having a higher impurity concentration than the p-well 8.

The second circuit element T2 implements a p-n-p junction structure with a triple-diffusion structure including the p-well 8, the n-well 9, and the $p^+$-type fifth main electrode region 15 and sixth main electrode region 16 at the upper part of the high specific-resistance layer 2. The n-well 9 serving as a back gate region of the second circuit element T2 is electrically isolated from the high specific resistance layer 2 to be used at a floating potential due to the p-n-p junction structure.

A flat control electrode structure (17, 18) laterally extends on the n-well 9. The control electrode structure (17, 18) includes a gate insulating film 17 provided on the n-well 9 between the fifth main electrode region 15 and the sixth main electrode region 16, and a gate electrode 18 deposited on the gate insulating film 17. The gate electrode 18 electrostatically controls the surface potential of the n-well 9 via the gate insulating film 17 so as to form an inversion channel in the surface layer of the n-well 9. A field oxide film such as a local insulating film (a LOCOS film) (not illustrated) is selectively provided between the first circuit element T1 and the second circuit element T2 and between the first circuit element T1 and the output-stage element T0 on the top surface of the high specific-resistance layer 2, for example.

The sixth main electrode region 16 is connected to a switching element T3. The switching element T3 is a pMOS transistor, for example. The switching element T3 may be provided in the n-well 9, or may be provided in a region different from the circuit part 200 in the same semiconductor chip. A gate of the switching element T3 is connected to an input terminal IN to which an input signal for driving the output-stage element T0 is input via an inverter 33.

The switching element T3 is led to an ON state in accordance with the input signal from the input terminal IN during a normal operation, and supplies the power supply voltage to the first circuit element T1 and the second circuit element T2 implementing the CMOS. The switching element T3 is led to an OFF state in accordance with the input signal in a particular state such as on standby other than the normal operation, and stops the supply of the power supply voltage to the first circuit element T1 and the second circuit element T2 implementing the CMOS, so as to achieve a decrease in power consumption.

A well contact region 28 of $p^+$-type having a higher impurity concentration than the p-well 8 is provided in the p-well 8. The well contact region 28 is connected with a second potential terminal GND. A ground potential as a second potential V2 on the low potential side lower than the first potential V1 on the high potential side is applied to the second potential terminal GND.

The circuit part 200 further includes an edge structure (a potential supply circuit) 201 provided in the p-well 8 at a circumference of the n-well 9. The edge structure 201 constantly fixes the potential of the n-well 9 to a third potential V3 higher than the second potential V2 in the normal operation and in the particular state such as on standby other than the normal operation. The edge structure 201 includes an enhancement-mode (referred to below as "E-mode") transistor T11, a depletion-mode (referred to below as "D-mode") transistor T12, and a voltage regulator diode (a Zener diode) D1.

The E-mode transistor T11 includes a first main terminal region (a source region) including a region common to the n-well 9, and a second main terminal region (a drain region) 19 of $n^-$-type provided in the p-well 8 separately from the n-well 9. The E-mode transistor T11 further includes a gate insulating film 21 provided on the p-well 8 between the n-well 9 serving as the first main terminal region and the second main terminal region 19, and a first control electrode (a gate electrode) 22 deposited on the gate insulating film 21. An edge contact region 20 of $n^+$-type having a higher impurity concentration than the second main terminal region 19 is provided in the second main terminal region 19. The edge contact region 20 is connected to a base body contact region 14 of $n^+$-type selectively provided at the upper part of the high specific-resistance layer 2 via a wire 31.

The Zener diode D1 includes a third main terminal region (an anode region) 23 of p-type provided in the p-well 8 and having a higher impurity concentration than the p-well 8, and a fourth main terminal region (a cathode region) 24 of $n^+$-type provided in the third main terminal region 23. The third main terminal region 23 is provided in the p-well 8 separately from the n-well 9 and the second main terminal region 19. The p-n junction between the third main terminal region 23 and the fourth main terminal region 24 implements the Zener diode D1.

The D-mode transistor T12 includes a fifth main terminal region (a source region) including a region common to the fourth main terminal region 24, and a sixth main terminal region (a drain region) including a region common to the second main terminal region 19. A channel formation region 25 of n-type for the D-mode transistor T12 is defined in the p-well 8 between the second main terminal region 19 serving as the sixth main terminal region and the fourth main terminal region 24 serving as the fifth main terminal region. One end of the channel formation region 25 is in contact with the fourth main terminal region 24. The other end of the channel formation region 25 is in contact with the second main terminal region 19. An impurity concentration of the channel formation region 25 may be either higher than or substantially the same as the impurity concentration of the second main terminal region 19. The impurity concentration of the channel formation region 25 is regulated to a value (a resistance) capable of inverting the conductivity type at the part overlapping with the p-type third main terminal region 23.

The D-mode transistor T12 further includes a gate insulating film 26 deposited on the channel formation region 25, and a second control electrode (a gate electrode) 27 deposited on the gate insulating film 26. The gate electrode 27 is connected to the fourth main terminal region 24 and the gate electrode 22 via a wire 32.

Figure 2:
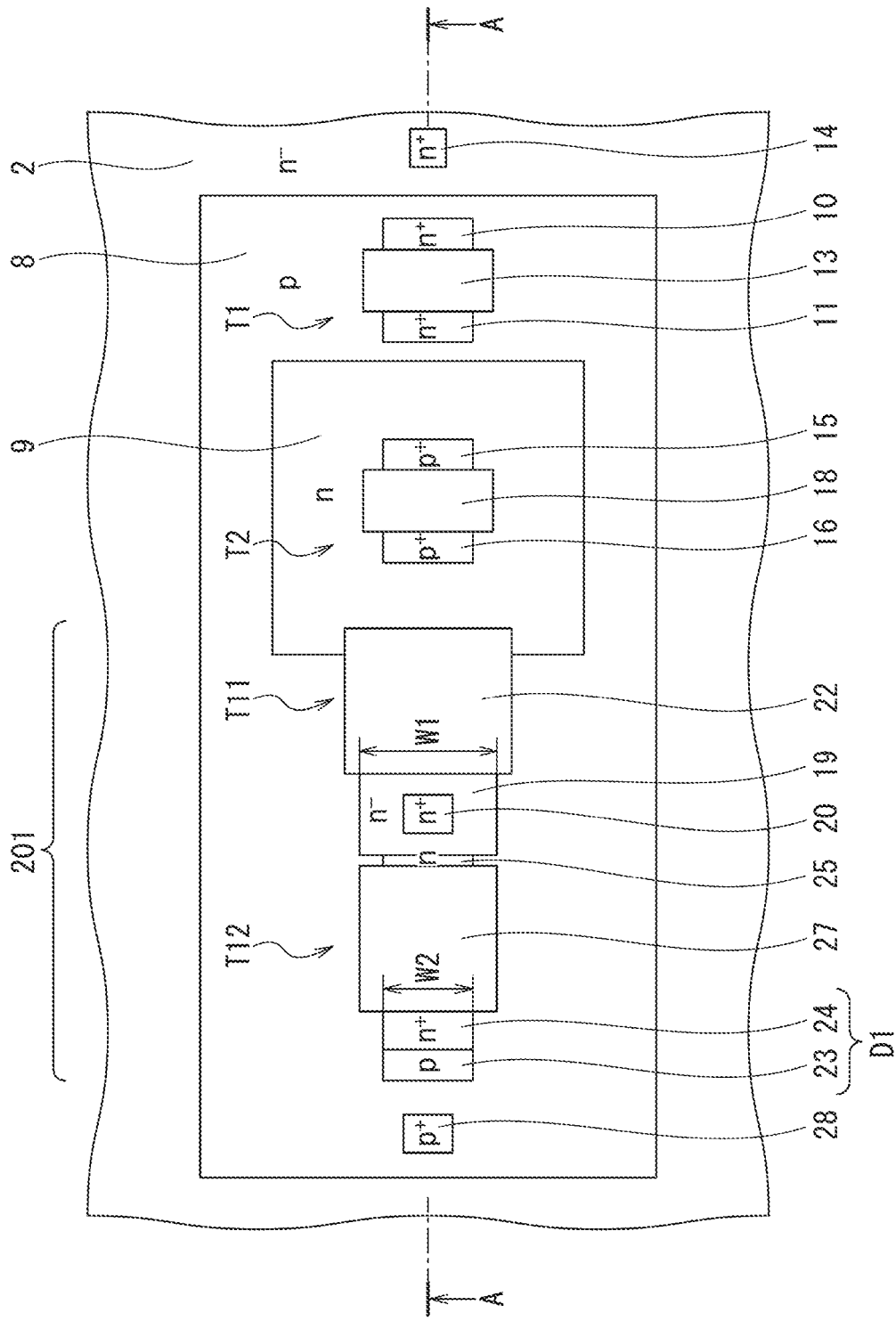
FIG. 2 is a plan view of the main components illustrating the example of the semiconductor integrated circuit according to the embodiment.

FIG. 2 is a plan view of the circuit part 200 illustrated in FIG. 1. The cross-sectional view as viewed from A-A direction in FIG. 2 corresponds to FIG. 1. As illustrated in FIG. 2, the p-well 8 is formed into a frame-like shape (a circular shape) surrounding the circumference of the n-well 9, for example. The edge structure 201 is arranged on the left side of the n-well 9, for example. The edge structure 201 may be provided at several points at the circumference of the n-well 9. The planar layout of the p-well 8, the n-well 9, and the edge structure 201 may be determined as appropriate.

Figure 3:
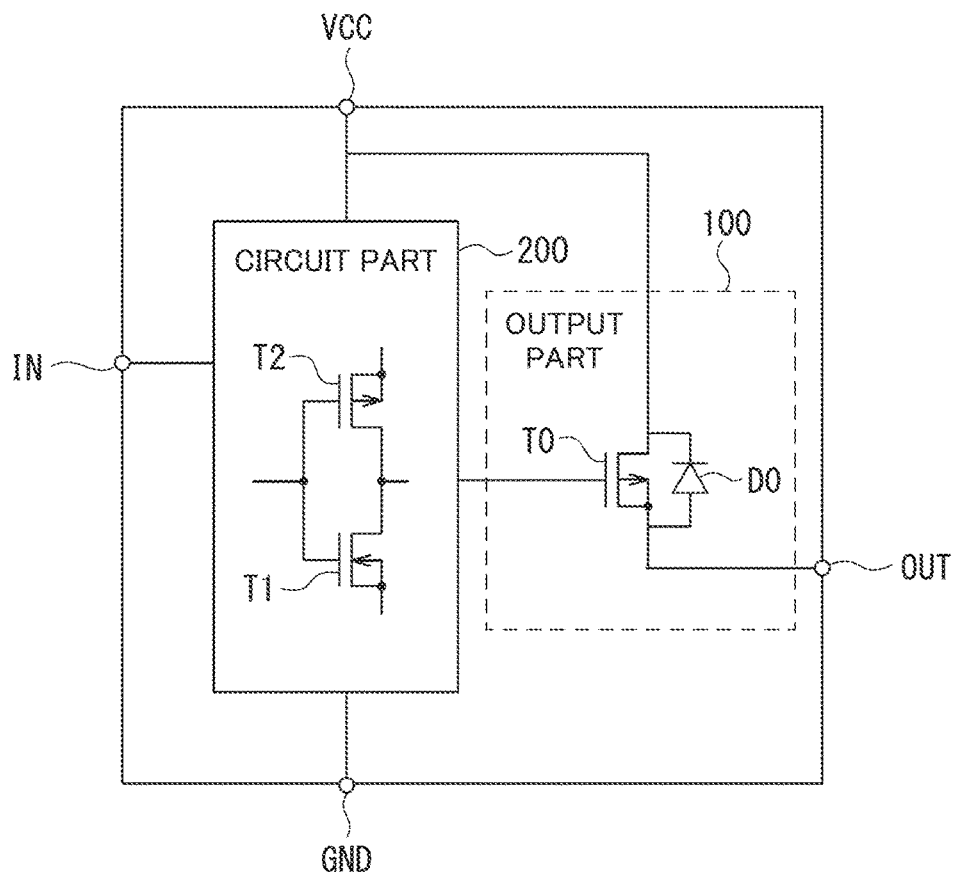
FIG. 3 is an equivalent circuit diagram illustrating the example of the semiconductor integrated circuit according to the embodiment.

FIG. 3 is an equivalent circuit diagram of the semiconductor integrated circuit according to the embodiment illustrated in FIG. 1. FIG. 3 also shows that the semiconductor integrated circuit according to the embodiment includes the output part 100 and the circuit part 200. The first circuit element T1 and the second circuit element T2 of the circuit part 200 corresponds to a part of a control circuit for controlling the output part 100, for example. Although not illustrated in FIG. 3, the switching element T3 illustrated in FIG. 1 is connected to the second circuit element T2 on the drain side. As illustrated in FIG. 3, the output-stage element T0 in the output part 100 is connected with a freewheeling diode D0. The first main electrode region (the drain region) of the output-stage element T0 is connected to the first potential terminal VCC, and the second main electrode region (the source region) is connected to the output terminal OUT.

Figure 4:
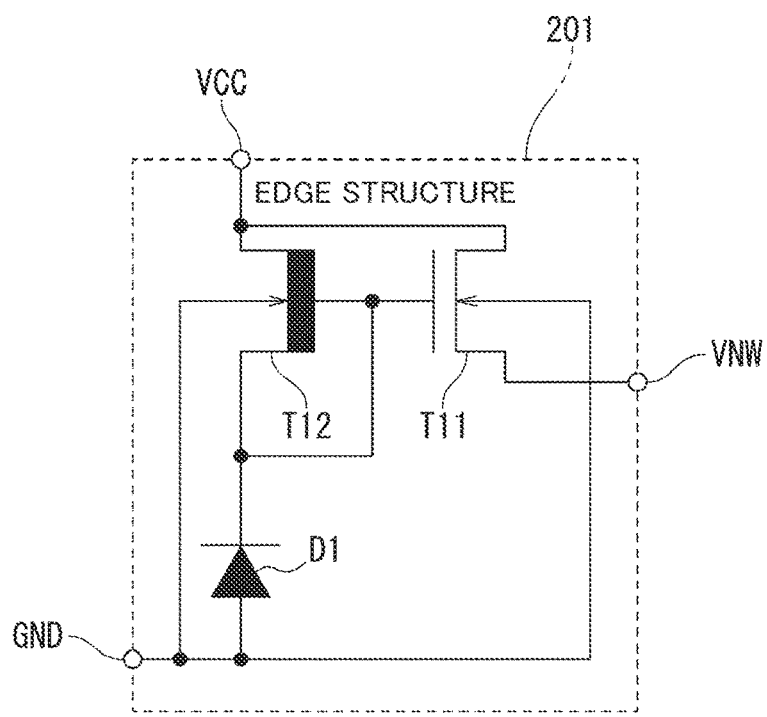
FIG. 4 is an equivalent circuit diagram illustrating an example of an edge structure according to the embodiment.

FIG. 4 is an equivalent circuit of the edge structure 201 in the semiconductor integrated circuit according to the embodiment illustrated in FIG. 1. The first main terminal region (the source region) of the E-mode transistor T11 is connected to a potential supply terminal VNW having a potential equal to the n-well 9. The second main terminal region (the drain region) of the E-mode transistor T11 is connected to the first potential terminal VCC. A threshold voltage Vth of the E-mode transistor T11 is about one volt, for example.

As illustrated in FIG. 4, the third main terminal region (the anode region) of the Zener diode D1 is connected to the second potential terminal GND. The fourth main terminal region (the cathode region) of the Zener diode D1 is connected to the first control electrode (the gate electrode) of the E-mode transistor T11, and the second control electrode (the gate electrode) and the fifth main terminal region (the source region) of the D-mode transistor T12. A breakdown voltage Vz of the Zener diode D1 is in a range of about 5 to 10 volts, for example. The Zener diode D1 outputs a constant voltage Vz.

The sixth main terminal region (the drain region) of the D-mode transistor T12 is connected to the first potential terminal VCC and the second main terminal region (the drain region) of the E-mode transistor T11. The D-mode transistor T12 functions as a pinch resistor.

The third potential V3 of the source of the E-mode transistor T11 is given by the following formula:

$$V3 = V2 + Vz - Vth - \alpha \quad (1)$$

where α is a back gate effect, and is in a range of about 1 to 2 volts, for example. Choosing the transistor and the Zener diode having appropriate characteristics can lead the third potential V3 to be greater than the second potential V2 of the second potential terminal GND. The third potential V3 is in a range of about 5 to 10 volts, for example. The potential of the n-well 9 is clamped by the third potential V3 of the source of the E-mode transistor T11.

Comparative Example

Figure 5:
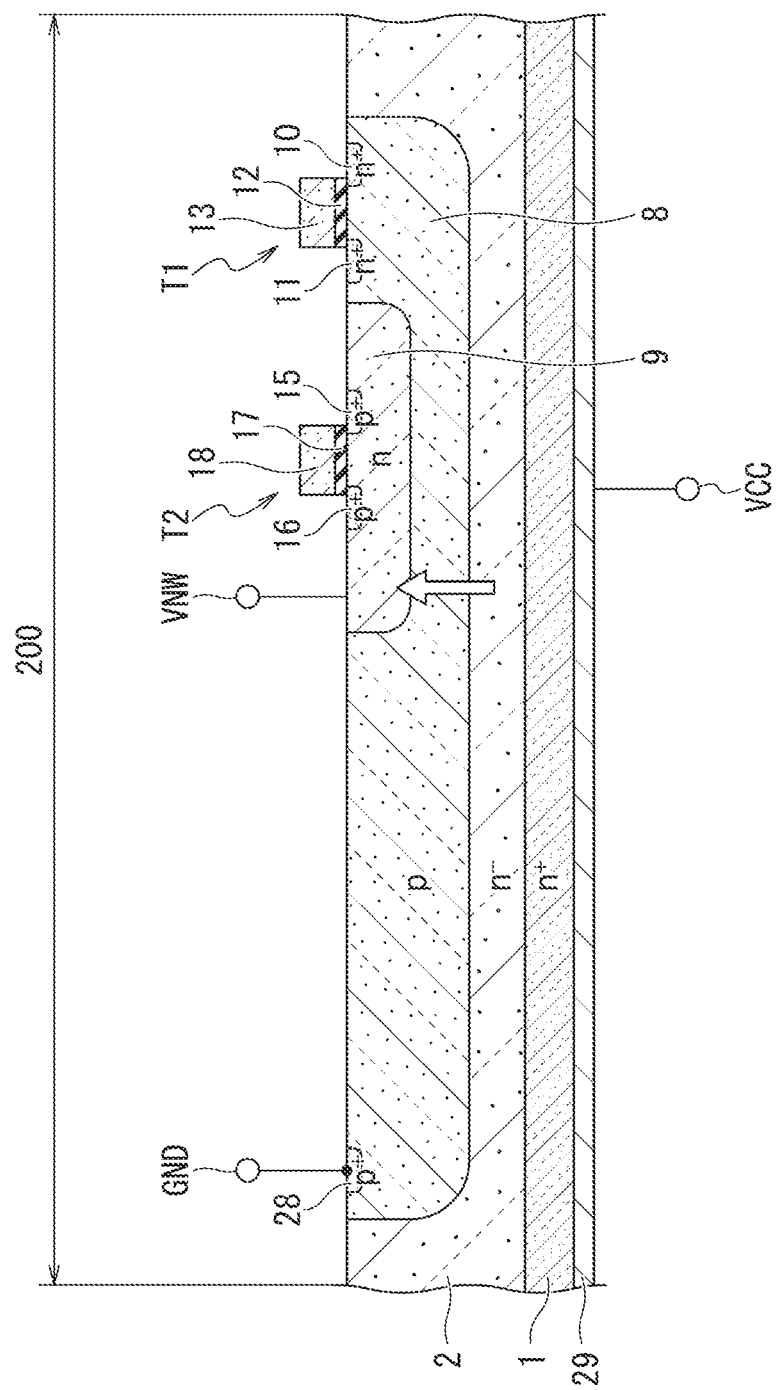
FIG. 5 is a cross-sectional view of main components illustrating an example of a semiconductor integrated circuit according to a comparative example.

A semiconductor integrated circuit of a comparative example is described below with reference to FIG. 5. FIG. 5 omits the illustration of the output part 100 illustrated in FIG. 1. As illustrated in FIG. 5, the semiconductor integrated circuit of the comparative example differs from the semiconductor integrated circuit illustrated in FIG. 1 in not including the edge structure 201 illustrated in FIG. 1. The n-well 9 is connected to the potential supply terminal VNW. The potential supply terminal VNW is connected to a circuit (not illustrated) provided in a region different from the circuit part 200.

In the normal operation of the semiconductor integrated circuit of the comparative example, the first potential V1 is applied to the first potential terminal VCC. The second potential V2 lower than the first potential V1 is applied to the second potential terminal GND. The third potential V3 lower than the first potential V1 and higher than the second potential V2 is applied to the potential supply terminal VNW from the circuit provided in the region different from the circuit part 200. The circuit is thus operated while fulfilling the potential relation of V1>V3>V2.

In the particular state such as on standby other than the normal operation in the semiconductor integrated circuit of the comparative example, the first potential V1 equivalent to the normal operation is applied to the first potential terminal VCC, but the third potential V3 is decreased to be equal to the second potential V2 to control the entire n-well 9 to correspond to the ground potential (V2=V3=GND), for example, in order to decrease the power consumption. The inventor found out that the leakage current was increased when the temperature was increased under this controlled condition, and the punch-through breakdown voltage was decreased in the n-p-n junction structure including the n⁻-type high specific-resistance layer 2, the p-well 8, and the n-well 9. The arrow shown in FIG. 5 schematically indicates the punch-through phenomenon.

In view of this, the semiconductor integrated circuit according to the embodiment includes the edge structure 201 in the p-well 8 at the circumference of the n-well 9, as illustrated in FIG. 1, FIG. 2, and FIG. 4. Controlling the third potential V3 of the n-well 9 to be constantly higher than the second potential V2 of the p-well 8 by the edge structure 201 leads the third potential V3 to be higher than the second potential V2 also in the particular state such as on standby. This can decrease the leakage current caused at a high temperature in the semiconductor integrated circuit of the comparative example as illustrated in FIG. 5, so as to avoid a decrease in the punch-through breakdown voltage in the n-p-n junction structure including the n⁻-type high specific-resistance layer 2, the p-well 8, and the n-well 9. Further, since the edge structure 201 is integrated in the p-well 8 in the circuit part 200, any other circuit does not need to be additionally provided on the outside of the p-well 8, achieving a reduction in size with a smaller area accordingly.

In addition, a reduction in area can be achieved such that the first main terminal region (the source region) of the E-mode transistor T11 includes the region common to the n-well 9, the fifth main terminal region (the source region) of the D-mode transistor T12 includes the region common to the fourth main terminal region 24, and the sixth main terminal region (the drain region) of the D-mode transistor T12 includes the region common to the second main terminal region 19.

While FIG. 1 illustrates the first main terminal region (the source region) of the E-mode transistor T11 that includes the region common to the n-well 9, the first main terminal region (the source region) of the E-mode transistor T11 may be provided separately from the n-well 9. While FIG. 1 illustrates the fifth main terminal region (the source region) of the D-mode transistor T12 that includes the region common to the fourth main terminal region 24 of the Zener diode D1, the fifth main terminal region (the source region) of the D-mode transistor T12 may be provided separately from the fourth main terminal region 24 of the Zener diode D1. While FIG. 1 illustrates the sixth main terminal region (the drain region) of the D-mode transistor T12 that includes the region common to the second main terminal region 19 of the E-mode transistor T11, the sixth main terminal region (the drain region) of the D-mode transistor T12 may be provided separately from the second main terminal region 19 of the E-mode transistor T11.

A gate length L1 of the E-mode transistor T11 is shorter than a gate length L2 of the D-mode transistor T12 as illustrated in FIG. 1, and a gate width W1 of the E-mode transistor T11 is greater than a gate width W2 of the D-mode transistor T12 as illustrated in FIG. 2. This configuration can decrease the amount of the current in the D-mode transistor to decrease the consumed current, and facilitate a flow of a large amount of current through the E-mode transistor T11. The gate length L1 may be equal to the gate length L2, or may be greater than the gate length L2. The gate width W1 may be equal to the gate width W2, or may be smaller than the gate width W2.

Example

Figure 6:
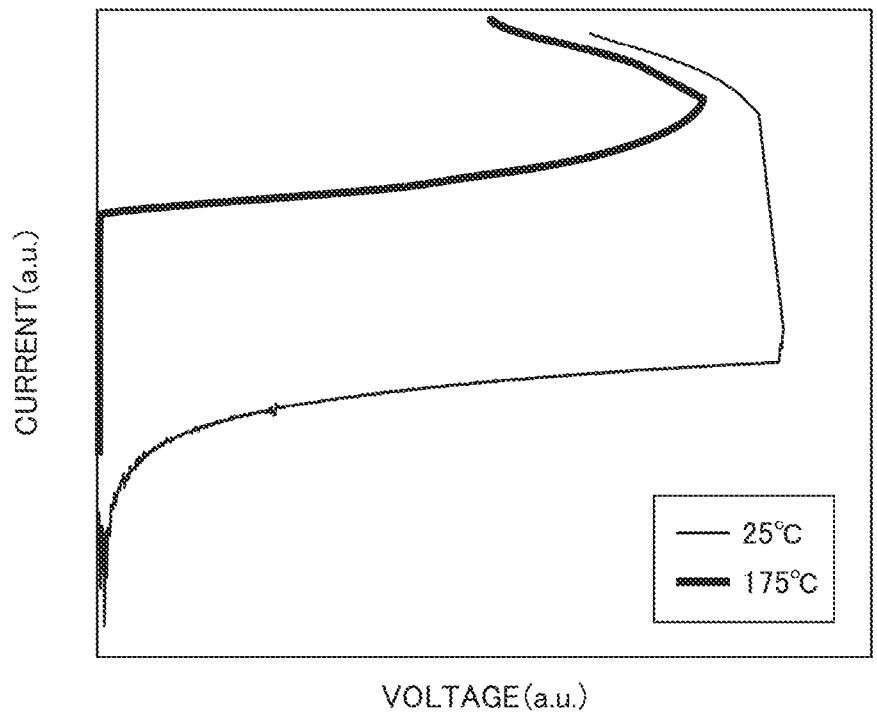
FIG. 6 is a graph illustrating I-V characteristics of the semiconductor integrated circuit of the comparative example.
Figure 7:
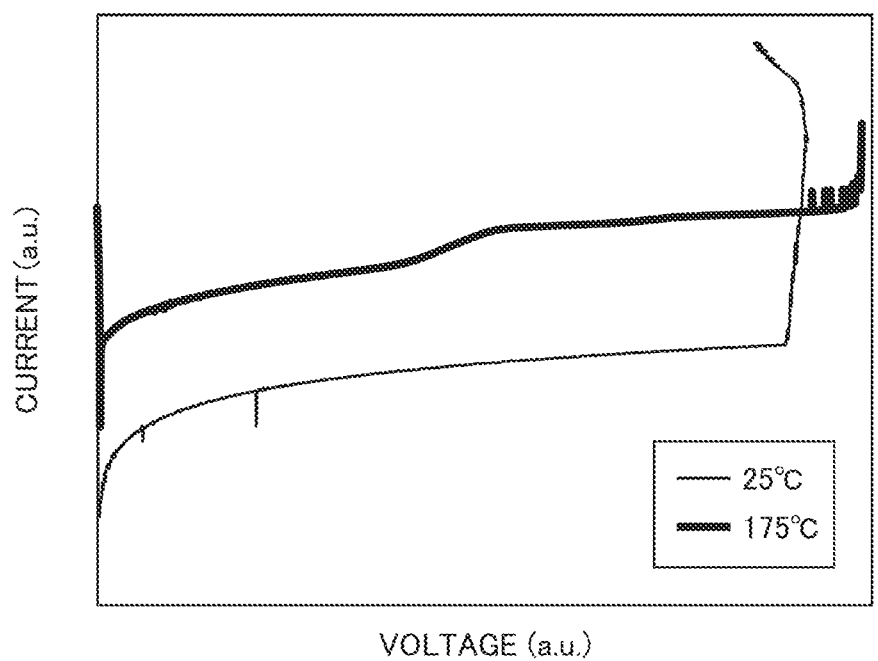
FIG. 7 is a graph illustrating I-V characteristics of the semiconductor integrated circuit of the embodiment.

FIG. 6 is a graph showing simulation results of I-V characteristics of the semiconductor integrated circuit of the comparative example at 25° C. and 175° C., and FIG. 7 is a graph showing simulation results of I-V characteristics of the semiconductor integrated circuit according to the embodiment at 25° C. and 175° C. In the semiconductor integrated circuit of the comparative example illustrated in FIG. 6, the first potential V1 was changed in a state in which zero volts were applied as the second potential V2 and the third potential V3. In the semiconductor integrated circuit according to the embodiment illustrated in FIG. 7, the first potential V1 was changed in a state in which zero volts were applied as the second potential V2, while five volts were applied as the third potential V3 greater than the second potential V2. In the semiconductor integrated circuit of the comparative example as illustrated in FIG. 6, the leakage current was increased at 175° C., and the punch-through breakdown voltage was decreased. In contrast, the simulation revealed that the semiconductor integrated circuit according to the embodiment illustrated in FIG. 7 could suppress the leakage current at 175° C., so as to have the improved punch-through breakdown voltage.

Modified Example

Figure 8:
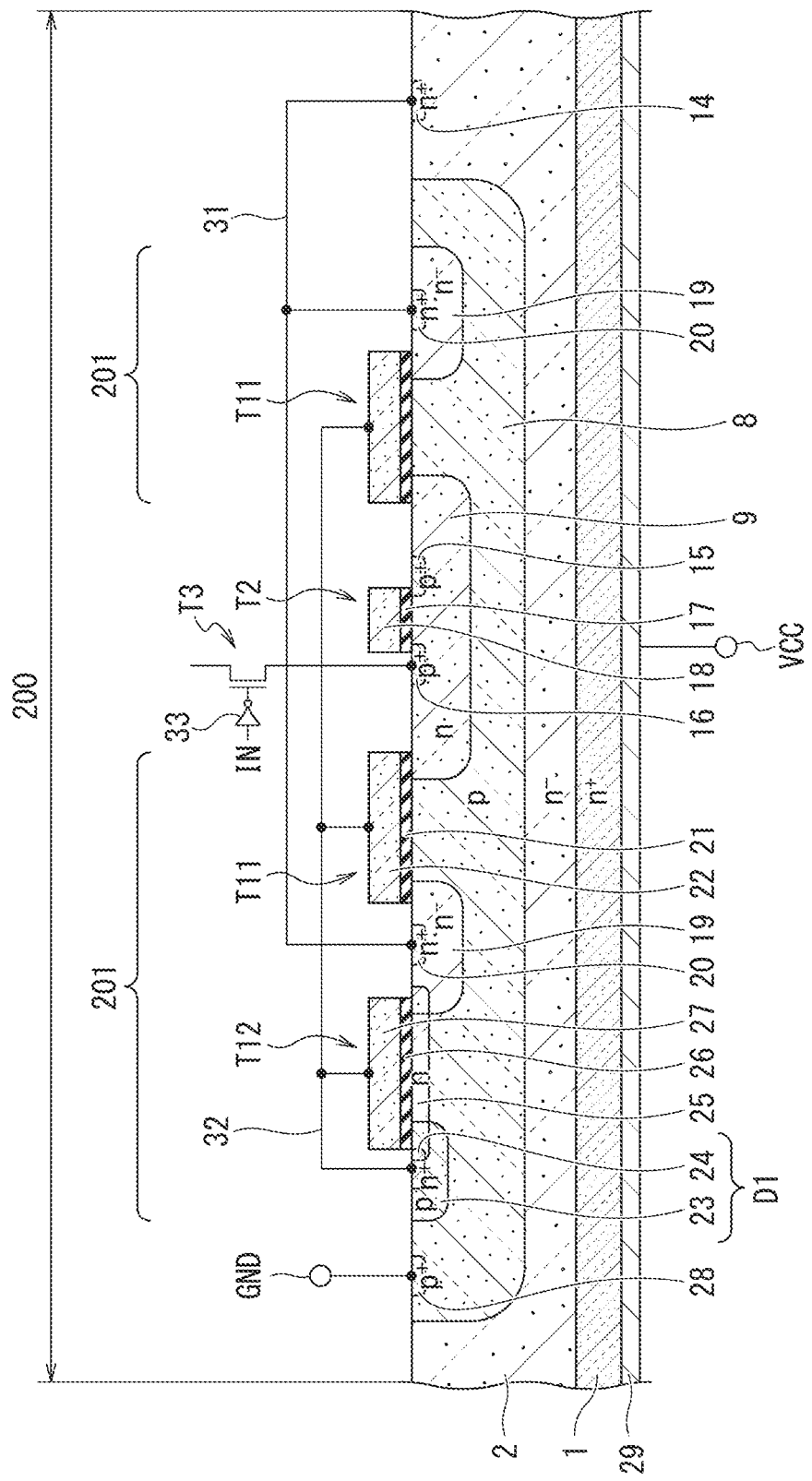
FIG. 8 is a cross-sectional view of main components illustrating an example of a semiconductor integrated circuit according to a modified example of an embodiment of the present invention.
Figure 9:
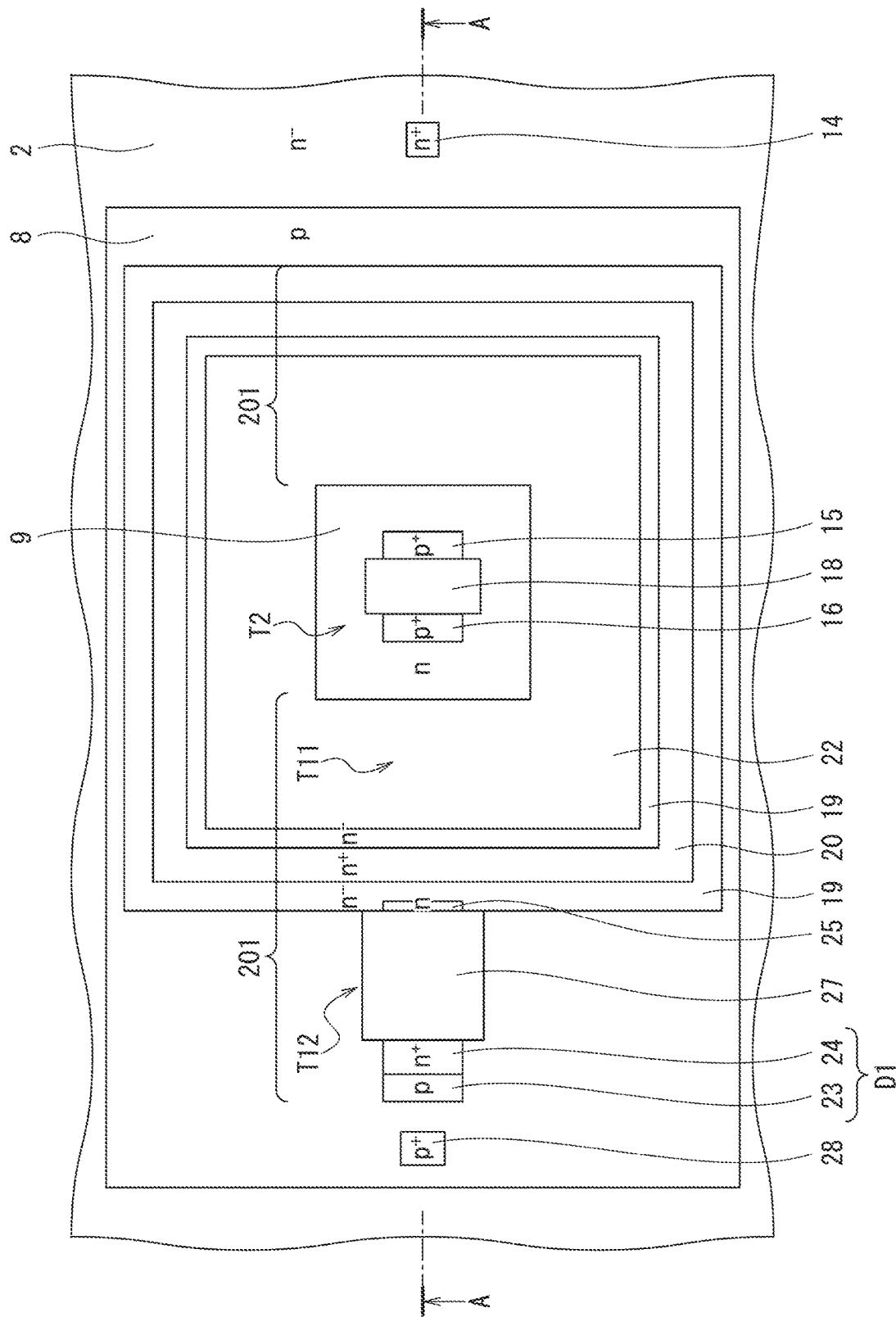
FIG. 9 is a plan view of the main components illustrating the example of the semiconductor integrated circuit according to the modified example of the embodiment.

A semiconductor integrated circuit according to a modified example of the embodiment differs from the semiconductor integrated circuit according to the embodiment illustrated in FIG. 1 and FIG. 2 in that the E-mode transistor T11 has a planar pattern formed into a frame-like shape (a circular shape) surrounding the n-well 9, as illustrated in FIG. 8 and FIG. 9. FIG. 8 corresponds to the cross-sectional view as viewed from A-A direction illustrated in the plan view of FIG. 9. Defining the planar pattern of the E-mode transistor T11 by the frame-like shape can increase the gate width of the E-mode transistor T11, and facilitate a flow of a large amount of current through the E-mode transistor T11. Although FIG. 8 and FIG. 9 omit the illustration of the first circuit element T1 illustrated in FIG. 1 and FIG. 2, the first circuit element T1 is provided in the p-well 8 surrounding the E-mode transistor T11, for example.

Other Embodiments

As described above, the invention has been described according to the embodiments, but it should not be understood that the description and drawings implementing a portion of this disclosure limit the invention. Various alternative embodiments of the present invention, examples, and operational techniques will be apparent to those skilled in the art from this disclosure.

For example, the embodiment has been illustrated above with the case of the trench gate MOS transistor as the output-stage element T0 in the output part 100, but is not limited to this case. The output-stage element T0 may be a trench gate IGBT, for example. When the output-stage element T0 is the IGBT, the low specific-resistance layer 1 illustrated in FIG. 1 only needs to be a semiconductor layer of $p^+$-type. The embodiment has been illustrated above with the case of the CMOS including the first circuit element T1 and the second circuit element T2 as a circuit for control included in the circuit part 200, but is not limited to the CMOS, and may use a circuit for control implemented by any other semiconductor elements.

The embodiment has been illustrated above with the case of using Si as the semiconductor base body (1, 2). The embodiment may also be applied to a case of using, other than Si, a material of a semiconductor having a greater band gap (a wide band-gap semiconductor) than Si, such as silicon carbide (SiC), gallium nitride (GaN), diamond, and aluminum nitride (AlN).

FIG. 1 illustrates the case in which the semiconductor base body (1, 2) has the structure in which the $n^-$-type high specific-resistance layer 2 is epitaxially grown on the low specific-resistance layer 1 of the $n^+$-type semiconductor substrate, but the embodiment is not limited to this case. For example, an $n^+$-type buried layer epitaxially grown on a p-type support substrate (a semiconductor wafer) may be used instead of the low specific-resistance layer 1, and the $n^-$-type high specific-resistance layer 2 may be further epitaxially grown on the $n^+$-type buried layer so as to implement a semiconductor base body having a triple-layer structure. In the case of the semiconductor base body with the triple-layer structure using the $n^+$-type buried epitaxial layer instead of the low specific-resistance layer 1, a sinker region may be provided that extends from the top surface of the high specific-resistance layer 2 to reach the buried epitaxial layer. Namely, the high specific-resistance layer 2 on the top surface side may be connected to the $n^+$-type buried epitaxial layer functioning as a drain region via the sinker region. In this case, a drain electrode wire is provided on the top surface side of the high specific-resistance layer 2. In the case of using the $n^+$-type buried epitaxial layer instead of the low specific-resistance layer 1, a SOI structure may be used in which the support substrate on the bottom surface side is used as an insulator substrate.

As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. A semiconductor integrated circuit comprising:
a semiconductor base body of a first conductivity-type;
a bottom surface electrode to which a first potential is applied, the bottom surface electrode being provided on a bottom surface of the semiconductor base body;
a first well of a second conductivity-type to which a second potential lower than the first potential is applied, the first well being provided on a top surface side of the semiconductor base body;
a second well of the first conductivity-type provided in the first well; and
an edge structure provided in the first well and configured to supply a third potential higher than the second potential to the second well.

2. The semiconductor integrated circuit of claim 1, wherein the edge structure includes:
an enhancement-mode transistor including a first main terminal region of the first conductivity-type having a same potential of the second well and configured to supply the third potential, a second main terminal region of the first conductivity-type to which the first potential is applied, and a first control electrode configured to control a current flowing between the first main terminal region and the second main terminal region;
a Zener diode including a third main terminal region of the second conductivity-type to which the second potential is applied, and a fourth main terminal region of the first conductivity-type connected to the first control electrode; and
a depletion-mode transistor including a fifth main terminal region of the first conductivity-type connected to the fourth main terminal region, a sixth main terminal region of the first conductivity-type to which the first potential is applied, and a second control electrode connected to the first control electrode and configured to control a current flowing between the fifth main terminal region and the sixth main terminal region.

3. The semiconductor integrated circuit of claim 2, wherein the first main terminal region includes a region common to the second well.

4. The semiconductor integrated circuit of claim 2, wherein the second main terminal region is provided in the first well separately from the first main terminal region, and is connected to the semiconductor base body via a first wire.

5. The semiconductor integrated circuit of claim 2, wherein:
the enhancement-mode transistor further includes a first gate insulating film provided on the first well between the first main terminal region and the second main terminal region; and
the first control electrode is deposited on the first gate insulating film.

6. The semiconductor integrated circuit of claim 2, wherein the third main terminal region is a semiconductor region having a higher impurity concentration than the first well and provided in the first well separately from the second well and the second main terminal region.

7. The semiconductor integrated circuit of claim 2, wherein the fourth main terminal region is provided in the third main terminal region to implement a p-n junction together with the third main terminal region.

8. The semiconductor integrated circuit of claim 2, wherein the fifth main terminal region includes a region common to the fourth main terminal region.

9. The semiconductor integrated circuit of claim 2, wherein the sixth main terminal region includes a region common to the second main terminal region.

10. The semiconductor integrated circuit of claim 2, wherein:
the depletion-mode transistor further includes
a channel formation region of the first conductivity-type provided between the fifth main terminal region and the sixth main terminal region and capable of inverting the conductivity type at a part overlapping with the third main terminal region, and
a second gate insulating film deposited on the channel formation region; and
the second control electrode is deposited on the second gate insulating film, and is connected to the fifth main terminal region and the first control electrode via a second wire.

11. The semiconductor integrated circuit of claim 2, wherein the Zener diode has a breakdown voltage in a range of 5 to 10 volts.

12. The semiconductor integrated circuit of claim 2, wherein the enhancement-mode transistor has a shorter gate length than the depletion-mode transistor.

13. The semiconductor integrated circuit of claim 2, wherein the enhancement-mode transistor has a greater gate width than the depletion-mode transistor.

14. The semiconductor integrated circuit of claim 2, wherein the enhancement-mode transistor has a planar pattern surrounding the second well.

15. The semiconductor integrated circuit of claim 1, wherein the edge structure constantly fixes the second well to the third potential in a normal operation and in a particular state.

16. The semiconductor integrated circuit of claim 1, further comprising a switching element configured to supply a power supply voltage to the second well in a normal operation, and stop supply of the power supply voltage to the second well in a particular state.

* * * * *